United States Patent [19]  [11] 4,322,638
Lee et al.  [45] Mar. 30, 1982

[54] IMAGE SENSOR ADAPTABLE FOR FAST FRAME READOUT

[75] Inventors: Teh-Hsuang Lee, Webster; Rajinder P. Khosla, Pittsford, both of N.Y.

[73] Assignee: Eastman Kodak Company, Rochester, N.Y.

[21] Appl. No.: 112,482

[22] Filed: Jan. 16, 1980

[51] Int. Cl.³ .................. H03K 3/42; G11C 19/28; H01L 29/78; H01L 27/14

[52] U.S. Cl. ............................ 307/311; 307/221 D; 357/24; 357/30

[58] Field of Search ............ 357/24, 30; 307/221 D, 307/311

[56] References Cited

U.S. PATENT DOCUMENTS

| | | | |
|---|---|---|---|
| 3,771,149 | 11/1973 | Collins et al. | 357/24 |
| 3,805,062 | 4/1974 | Michon et al. | 357/24 |
| 3,836,773 | 9/1974 | Burke et al. | 357/24 |
| 3,866,067 | 2/1975 | Amelio | 357/24 |
| 3,882,531 | 5/1975 | Michon et al. | 357/24 |
| 4,028,719 | 6/1977 | Curtis | 357/24 |
| 4,117,510 | 9/1978 | Ohta et al. | 357/24 |
| 4,155,094 | 5/1979 | Ohba et al. | 357/24 |
| 4,194,213 | 3/1980 | Kano et al. | 357/24 |
| 4,200,892 | 4/1980 | Weimer | 357/24 |

OTHER PUBLICATIONS

Sequin et al., *Charge Transfer Devices*, Academic Press, New York, (1975), pp. 152-157.
Hobson, *Charge Transfer Devices*, John Wiley, New York (1978), pp. 169-172.
Jespers, "Three-Terminal Charge Injection Device", IEEE J. Solid-State Circuit, vol. SC-11 (2/76), pp. 133-138.
Jespers et al., "Three Terminal CID Devices", NATO Advanced Study Institute, Solid State Imaging, Louvain-la-Neuve, Belgium (9/75), 13 pp. 11 figures.

*Primary Examiner*—Gene M. Munson
*Attorney, Agent, or Firm*—Thomas H. Close

[57] ABSTRACT

An area image sensor comprised of an array of photosites arranged in rows and columns is disclosed. The sensor is readable in blocks of adjacent photosite rows, thereby to enable operation of the sensor at frame rates on the order of thousands of frames per second.

12 Claims, 13 Drawing Figures

FEWEST NUMBER OF PHOTOSITE ROWS PER BLOCK

FIG. 7b

LARGEST NUMBER OF PHOTOSITE ROWS PER BLOCK

IMAGE SENSOR ADAPTABLE FOR FAST FRAME READOUT

FIELD OF THE INVENTION

The present invention relates to an area image sensor suited for fast frame readout and, more particularly, to an area image sensor that is so designed as to be readable in blocks of adjacent photosite rows.

DESCRIPTION RELATIVE TO THE PRIOR ART

A typical area image sensor is comprised of an array of charge-integrating photosites arranged in rows and columns. The amount of charge integrated per unit time at each photosite is proportional to the intensity of incident radiation. Imaging a scene onto an area image sensor, therefore, results in a spatial distribution of charge packets wherein the amount of charge in each respective packet represents a corresponding picture element, or pixel, of frame information.

It is known to read out an area image sensor in a serial line or a parallel line format. In serial line readout, the sensor is read out one line at a time to provide a line sequential output signal. In parallel line readout, all lines are read out simultaneously to provide an output signal comprised of numerous individual line signals which are electrically in parallel. It is not, at present, possible to obtain "fast" frame rates (i.e., frame rates above about 120 frames per second) from a state-of-the-art area image sensor by using the serial line method of sensor readout. This is because the maximum data rate at which such a sensor can be read out is limited to about 10 MHz. Thus, a sensor containing, for example, 60,000 pixels of frame information can be read out at a maximum frame rate of only about 120 frames per second. The parallel line method of sensor readout, on the other hand, can provide readout at fast frame rates (because all lines are read simultaneously), but the results are far from satisfactory because of the practical problems associated with electronically processing, in a virtually identical manner, numerous line signals. For example, were a sensor having 200 rows of photosites read out by the parallel line method, it would be necessary to provide 200 separate but identically operating amplifier, detector, etc., circuits. There are also problems associated with the recording of 200 separate signal tracks on a standard sized (such as 1 inch wide) magnetic tape.

U.S. patent application Ser. No. 112,483, filed Jan. 16, 1980, in the name of James A. Bixby, discloses a technique for sensor readout that provides fast frame rates without the numerous line signals associated with the parallel line method of sensor readout. According to that disclosure, a sensor is read out by way of "blocks" of photosites, with each block being comprised of a plurality of adjacent photosite rows. The resulting output signal is thus comprised of block information in a "serial" format, while the information content of each block is comprised of a plurality of line signals in a "parallel" format, such line signals corresponding to the individual photosite rows within that block. A specific example of block readout is given wherein a sensor having 192 rows is divided, for purposes of readout, into six blocks having 32 rows each. Assuming the sensor is readable at a frame rate of 60 frames per second using the serial line readout method, such sensor can be read out at $60 \times 32 = 1920$ frames per second using the block readout method disclosed in U.S. patent application Ser. No. 112,483. Moreover, such readout results in only 32 relatively easy-to-record row signals, as opposed to the 192 signals that would result were the sensor read out by the parallel line method.

SUMMARY OF THE INVENTION

In accordance with the present invention, area image sensor apparatus is disclosed that is specially configured for "block" readout. Conceptually, the present invention calls for the use of three gate structures per photosite—one gate structure being for block enabling, another being for column addressing, and the last being to isolate the photosite from a read channel. Although the isolating gate structure cannot be allowed to transmit rotation, either or both of the other gate structures must be transmissive to incident radiation.

In one of its more basic forms, the invention provides a subassembly for use in a photosensitive device such as an area image sensor. The subassembly includes a substrate structure comprised of a semiconductor material of one conductivity type having an overlying layer of insulating material. An electrically conductive enable gate structure, transmissive to incident radiation, extends across a length of the substrate structure. An electrically conductive isolating gate structure extends across a length of the substrate structure in spaced relation to the enable gate structure. A plurality of electrically conductive address gate structures extend across, but are insulated from, the enable and isolating gate structures, thereby forming a plurality of photosites. A common read channel is provided into which the photosites are readable upon the application of proper signals to the various gate structures.

In a preferred embodiment, several of such subassemblies are combined to form an area image sensor that, by connecting the various gate structures in a manner described in detail below, is readable in blocks of adjacent photosite rows.

BRIEF DESCRIPTION OF THE DRAWINGS

In the detailed description of the preferred embodiments of the invention presented below, reference is made to the accompanying drawings, in which.

DETAILED DESCRIPTION OF THE PREFERRED EMBODIMENTS

Figure 1:
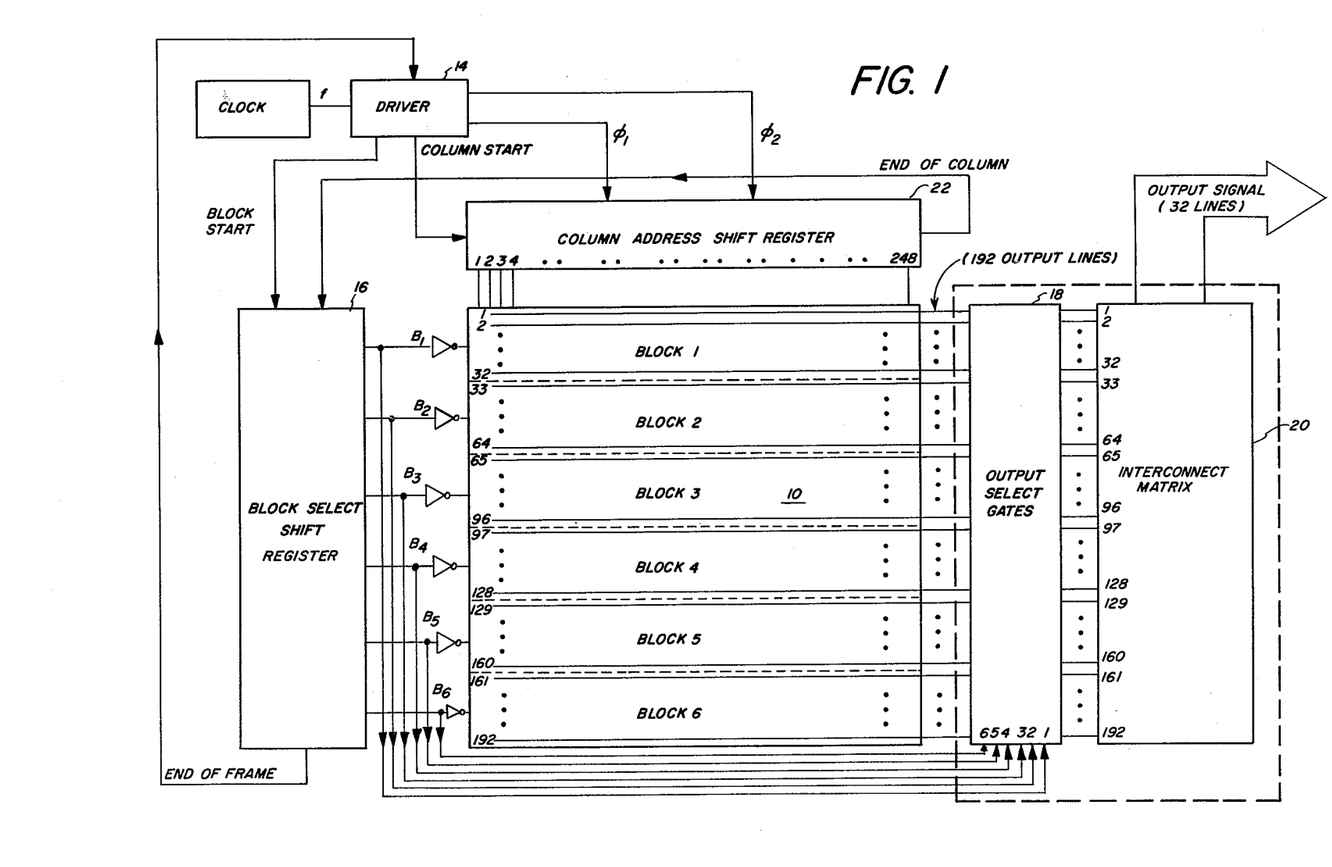
FIG. 1 is a schematic diagram useful in illustrating the overall operation of a sensor designed in accordance with the present invention.

Referring to FIG. 1, an area image sensor 10 is comprised of an array of photosites (not shown individually) arranged in 192 rows and 248 columns. For purposes of readout, the sensor 10 is formatted into six blocks of 32 photosite rows each. Each photosite is readable upon the application thereto of an enablement signal and an address signal. To begin readout, a driver 14 produces a "block start" signal that causes a block select electronic circuit in the form of a shift register 16 to produce an enablement signal that enables, via block enable line $B_1$, all photosites within block 1, i.e., rows 1-32. (The block 1 enablement signal also actuates a group of output select gates 18, in a manner and for purposes to be discussed in detail below with reference to FIG. 6.) Column address electronics, in the form of a shift register 22, sequentially addresses the 248 photosite columns of the entire area image sensor 10 to effect column-wise readout. Since the photosite rows within blocks 2-6 (rows 33-192) are not enabled when block 1 is enabled, only photosite rows 1-32 are read out at such time, the remaining photosites in the not-enabled blocks continuing to integrate charge in response to incident radiation. After all columns have been addressed, an "end of the column" signal sequences the block select shift register 16 to enable, via block enable line $B_2$, the block 2 photosite rows, i.e., rows 33-64. Column-wise readout then proceeds as described above for the block 1 photosite rows. This process is repeated until all 6 blocks of photosite rows are read out, at which time an "end of frame" signal from the block select shift register 16 resets the driver 14 for readout of the next frame.

The frame information thus produced is neither of the parallel nor the serial line formats discussed previously. Rather, block information is produced in series; and each such serial block contains 32 row signals arranged in parallel. A striking result of such a readout technique is the reduction of the time required for sensor readout by a factor of 32 (i.e., the number of photosite rows in a block). Attendantly, a sensor that can be read out at a maximum frame rate of, say, 60 frames per second using serial line readout can be read out at a rate of 1920 frames per second when operation is as described above.

Figure 2:
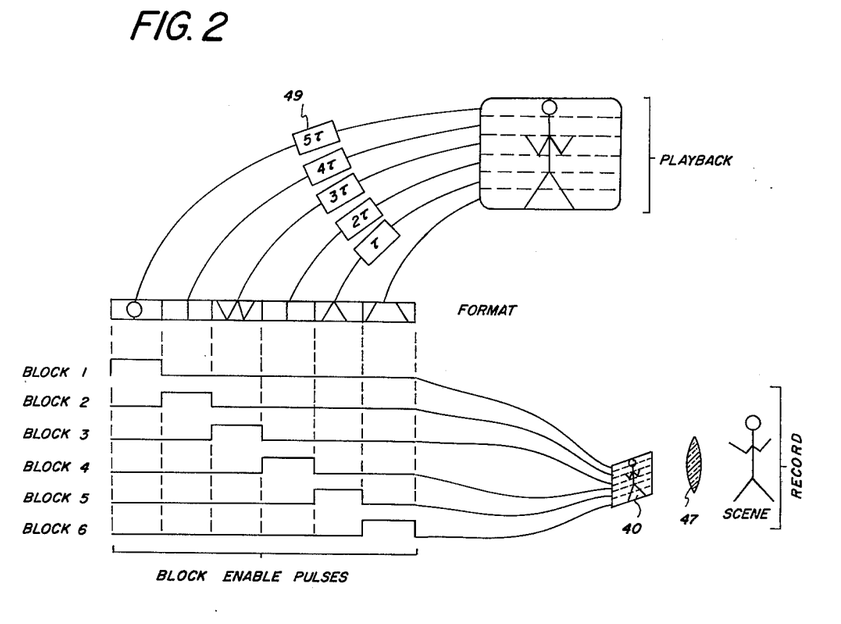
FIG. 2 is a graphic illustration of how frame information is processed in the block readout method of sensor readout.

FIG. 2 illustrates, graphically, how frame information, formatted as described above, may be recombined to form a video display. A scene, imaged by an optical system 47 onto the area image sensor 40, is "sampled" by block enable pulses. As will be noted, the frame information (labelled FORMAT) corresponding to each block is shown in "pictorial form" directly above its respective block enable pulse. And, by the use of appropriate delay circuits 49, the blocks of information are recombined to form the complete playback video display.

In accordance with the present invention, an area image sensor is provided that is suited for block readout. To understand the detailed operation of the sensor, reference should be had to FIGS. 3 and 4a-f. The block select and column address shift registers 16 and 22, respectively, operate as previously described in connection with FIG. 1. (To avoid cluttering FIG. 3, the driving electronic circuitry for registers 16 and 22 is not shown.) The sensor is comprised of an array of three-gate photosites arranged in rows and columns on an insulated, n-type semiconductor substrate material. Each row of photosites has a read channel constituting a source for a respective output gate ($OG_1$, $OG_2$, $OG_3$, etc.), the drains for the output gates being connected to an interconnect matrix 20 of conductive bus lines. Each read channel is a p+ region formed in the substrate by, for example, a diffusion or ion implantation process. A speed bar (not shown) overlies the p+ read channel.

Figure 3:
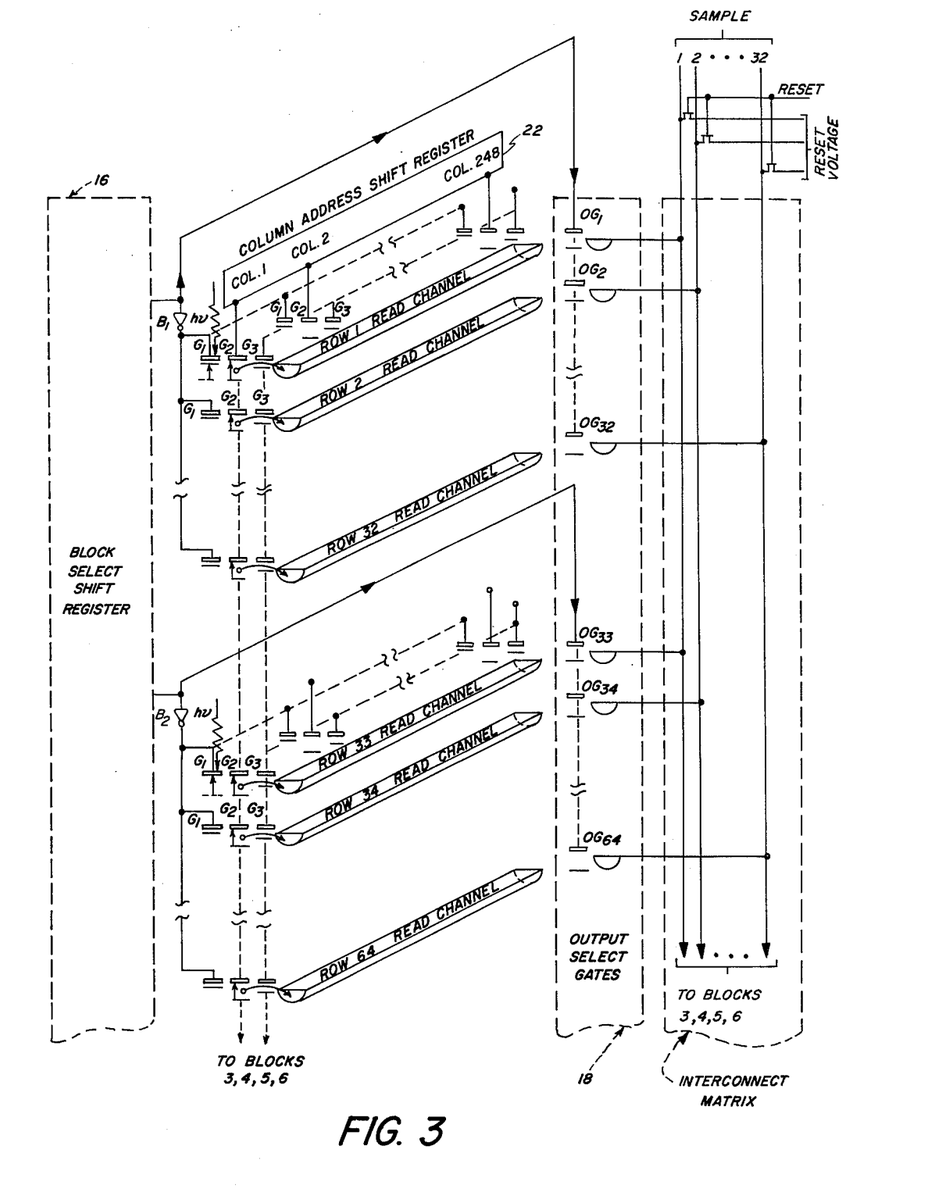
FIGS. 3 and 4a-4f are drawings useful in illustrating the operation of a sensor in accordance with the present invention.

The speed bar is a strip of conductive material (such as aluminum) that is generally insulated from the p+ read channel but which makes periodic contact therewith, for example at each photosite. The purpose of the speed bar is to serve as a light shield and to reduce the resistance of the p+ read channel, and thus its RC time constant, to enable charge carriers to move more quickly along the p+ read channel.

The output gates are grouped together in the sense that all gates $OG_1$-$OG_{32}$ for the block 1 photosite rows (rows 1-32) have their gate terminals connected in common. Similarly, the gate terminals of all gates $OG_{33}$-$OG_{64}$ associated with the block 2 photosite rows are connected in common, and so on for the remaining blocks. Aside from being connected to "blocks" of photosite rows, the block enable lines $B_1$-$B_6$ are connected to the gate terminals of respective blocks of output gates. As a result, enablement of a block of photosite rows causes the output gates associated with the enabled rows to be closed, thereby providing an electrical connection between each read channel within the enabled block and the interconnect matrix 20.

Figure 4A:
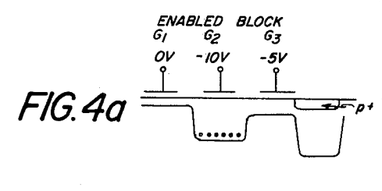
Figures 4B, 4C:
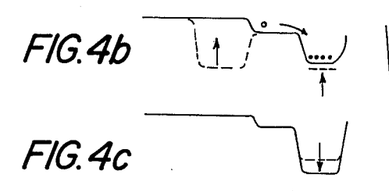
Figure 4D:
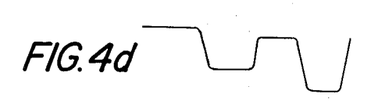
Figures 4E, 4F:
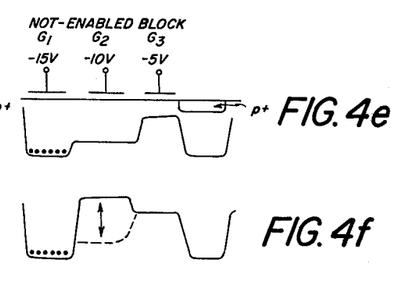

During the charge integration period before a block is enabled, representative potentials on the three gates (enable gate $G_1$, address gate $G_2$ and isolating gate $G_3$) of each photosite are as shown in FIG. 4e. During this period, charges are integrated in the semiconductor substrate material under each gate $G_1$ in response to incident radiation. The block to be read out, block 1 for example, is enabled by applying an enablement signal to the block enable line $B_1$ to bring each gate $G_1$ in block 1 (all of which are electrically connected) to approximately the substrate potential, as shown in FIG. 4a. As a result, the charges collected beneath each gate $G_1$ within the enabled block are transferred to the potential well beneath an adjacently disposed gate $G_2$. Column address commences upon the application of an address signal to the gates $G_2$ within column 1, bringing the potential of each gate $G_2$ to approximately the substrate potential. See FIG. 4b. The charges residing under each gate $G_2$ in column 1 of block 1 are then dumped into respective p+ read channels. The dumped charges then travel along the respective read channels to the output gates $OG_1$-$OG_{32}$.

The relatively shallow potential well beneath each gate $G_3$ (FIGS. 4a-4f), which is produced by the application of a low-level, steady-state dc potential (e.g., $-5$ volts) to each gate $G_3$, serves to isolate the read channels from the integrated charges until the photosites are column addressed. Upon such column addressing, these potential wells serve to "funnel" charges to the read channels.

Because each read channel is seen by the charge as a transmission line (i.e., a distributed RC circuit) it takes a finite time for charge to travel the length of the read channel to an output gate and to reach an equilibrium state. At a preset time after each gate $G_2$ is column-addressed (which preset time is sufficient to allow the charges in the read channel to reach equilibrium), a sample signal from an external clock commands external electronics to sample (via the interconnect matrix 20) the voltage of each read channel within the enabled block. These sampled voltage signals comprise the output signals for the addressed photosites. To eliminate residual charges in the read channels before the next column is addressed, a reset pulse is applied (by means not shown) to each of the read channels in block 1 to cause each read channel to return to its starting potential (FIG. 4c). (Alternatively, a reset pulse may be applied to the read channels in all blocks to eliminate charge accumulated therein.) Each gate $G_2$ in column 1 is then returned to its starting potential (FIG. 4d). The next column of photosites in the enabled block is now ready for address and readout in a similar manner.

The above procedure continues until all 248 columns in each of the 32 rows of block 1 have been read out. At this point, each gate $G_1$ in block 1 is brought to the not-enabled condition by the application of a negative (15 volt) potential (FIG. 4e) via block enable line $B_1$. Simultaneously, each gate $G_1$ in rows 33-64 of block 2 is enabled by the application of an enablement signal via block enable line $B_2$, i.e., the potential level of each gate $G_1$ in block 2 is brought up to approximately the substrate potential level (FIG. 4a). The block 2 photosite rows are now ready for column-wise readout in the manner described above. It should be noted that readout of block 2 does not cause any of the integrated charges in the block 1 rows (and block 3 through block 6 rows) to be dumped into the respective read channels even though each gate $G_2$ of block 1 photosites (and block 3 through block 6 photosites) is addressed during column addressing of the block 2 photosites. This is because a not-enabled block has a more negative potential applied to its gates $G_1$ than to its gates $G_2$ (FIG. 4e). Column address of a not-enabled block, therefore, merely causes the potential on each gate $G_2$ to seesaw, as illustrated in FIG. 4f.

Figure 5:
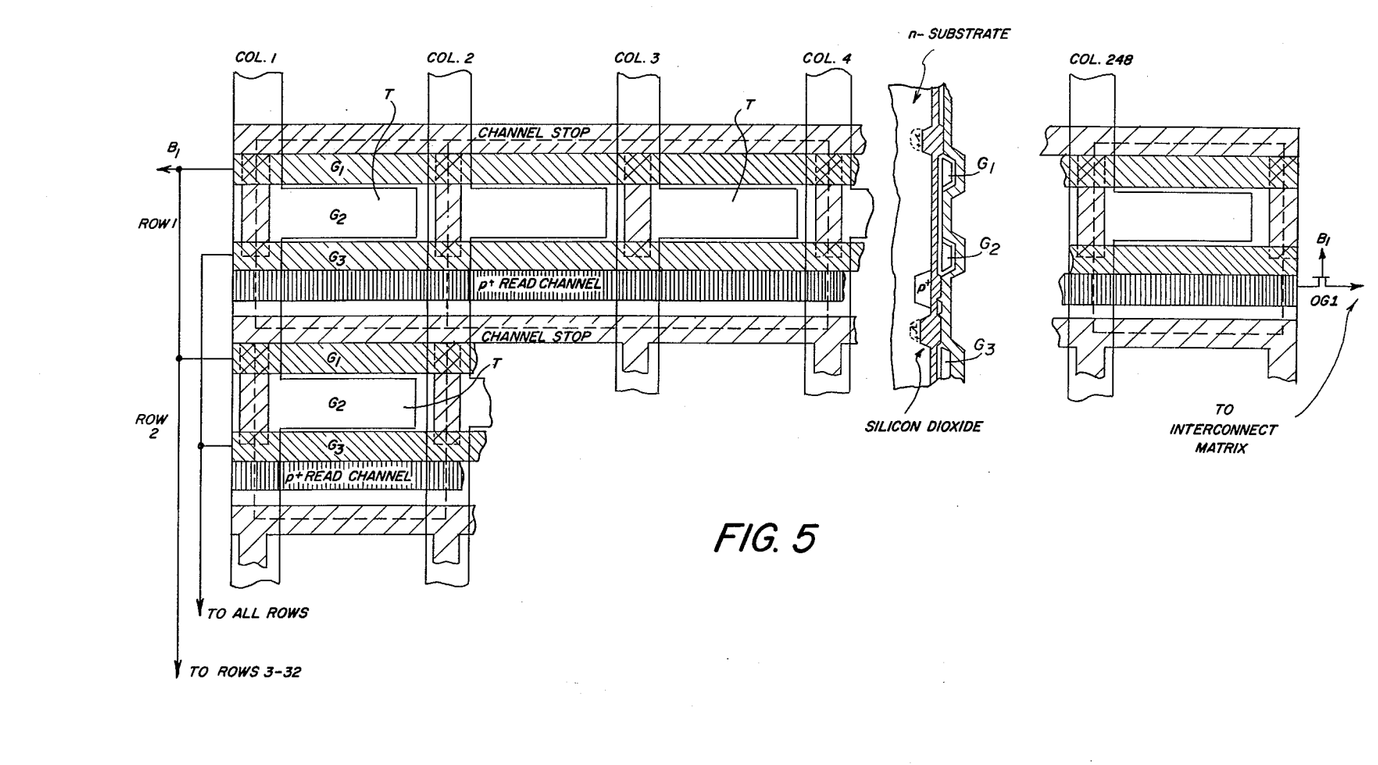
FIG. 5 depicts the construction of individual photosites.

The physical construction of an area image sensor that performs in accordance with the above description is shown in FIG. 5. The entire photosite array is formed on an n-type chip or substrate material having an insulating overcoat of silicon dioxide. The silicon dioxide overcoat has certain thick portions that, together with an additional n-type dopant therebeneath, form channel stops between the photosite rows to prevent migration of charges therebetween. The channel stops also extend between individual photosites in the columnar direction to prevent charge migration across adjacent columns. Each enable gate $G_1$ is formed of a strip of polysilicon that extends the length of a photosite row. Because polysilicon material is electrically conductive and transmits radiation in the visible and near infrared wavelength range, it serves both as an electrical gate and as a window to incident radiation, thereby allowing charge to be integrated in the underlying substrate material. Each enable gate $G_1$ within a block is electrically connected so that all photosite rows within the block are enabled upon the application of an enablement signal through a respective block enable line ($B_1$, $B_2$, ... $B_6$). Column address is effected by successively applying address signals to the address gates $G_2$. Each address gate $G_2$ extends across all 192 photosite rows, and has a tab portion T at each photosite, such tab portion extending into the space between the gates $G_1$ and $G_3$. The gates $G_2$ may be opaque (e.g., formed from aluminum) or transmissive (e.g., formed from polysilicon), although the quantum efficiency of each photosite is improved if the gates $G_2$ are constructed of a transmissive material because the area of charge integration is increased proportionately.

Each isolating gate $G_3$ is constructed of an electrically conductive strip that extends the length of each photosite row. Since the function of the isolating gates $G_3$ is to isolate charge integrating regions of the sensor from the read channels, charges cannot be allowed to integrate under the gates $G_3$, whereby they can spill over into the read channels. Thus, the gate $G_3$ may be comprised of a strip of (opaque) metal, e.g., aluminum, or, if preferred to facilitate the manufacturing process, the gates $G_3$ may be formed of a material transmissive to incident radiation (such as polysilicon), and then covered with a light shield (a layer of aluminum, for example). Because each gate $G_3$ in the sensor is maintained at the same potential, all such gates are connected in common.

Figure 6:
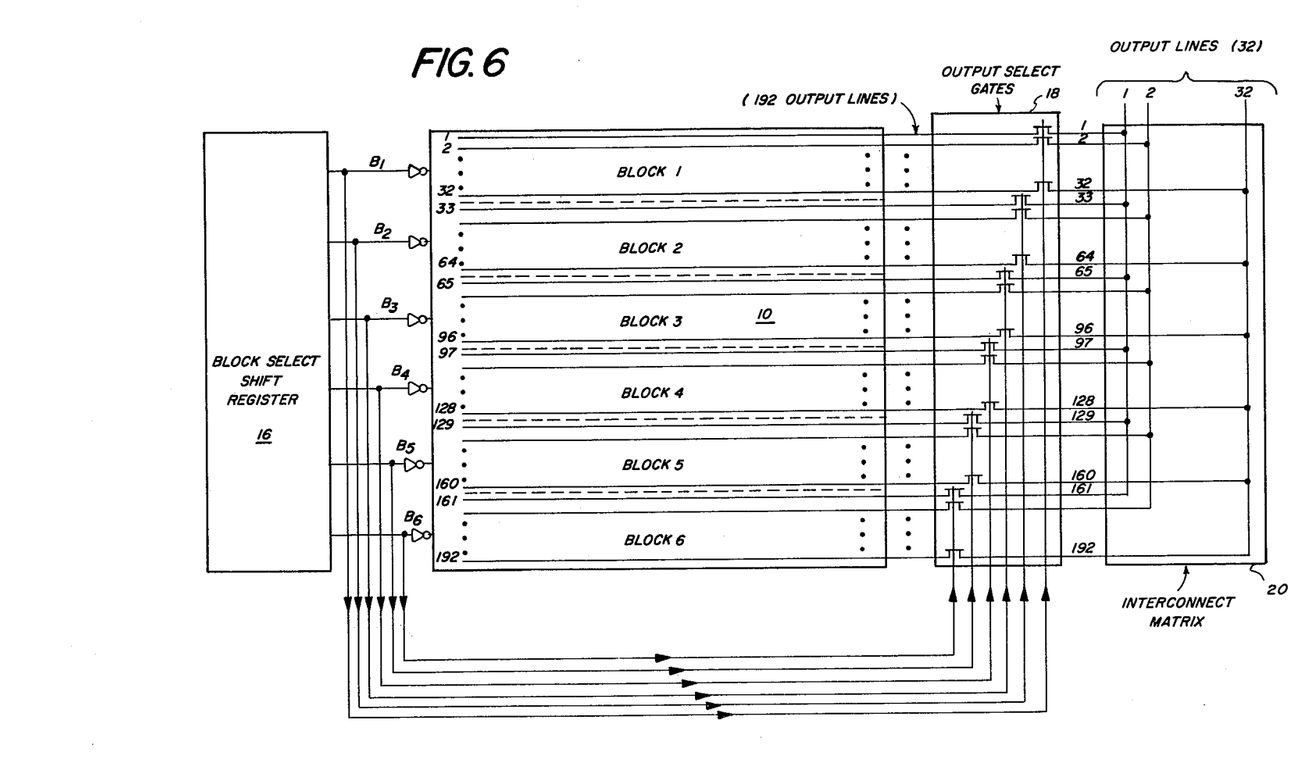
FIG. 6 is a schematic diagram useful in illustrating a technique for reducing the number of output bus lines of apparatus embodying the invention.

To minimize stray capacitance, it is desirable to manufacture the sensor 10, the output select gates 18 (FIG. 3), and the interconnect matrix 20 on a single integrated circuit chip thereby reducing the length of the various conductive bus lines. To further eliminate undesirable conductive bus lines, the output select gates 18 cooperate with the interconnect matrix 20 to reduce the total number of output bus lines from 192 (the number of photosite rows) to just 32 (the number of photosite rows per block), thereby reducing stray capacitance and saving chip space. Referring to FIG. 6, when block 1 is enabled, the block 1 output gates $OG_1$ through $OG_{32}$ are closed. The output signals from rows 1-32 are therefore passed to the interconnect matrix 20. Similarly, as block 2 is enabled, the block 1 output gates $OG_1$ through $OG_{32}$ revert back to their open states and the block 2 output gates $OG_{33}$ through $OG_{64}$ are closed, and so on as the remaining blocks are enabled and read out. The interconnect matrix 20 combines the 192 output lines from the sensor 10 into just 32 output lines through an arrangement of conductor bus lines connecting in common every 32nd output gate. For example, the output gates corresponding to rows 1, 33, 65, 97, 129 and 161 of blocks 1 through 6, respectively, have their output terminals connected. Because of the operation of the output select gates 18, signals from only one block of photosite rows are fed to the interconnect matrix 20 at any given time, thereby preventing an unwanted coupling of signals from non-enabled blocks. The output signal from the interconnect matrix 20 is, therefore, comprised of a serial train of blocks of information, with each block of information containing 32 row signals arranged in parallel.

Figure 7A:
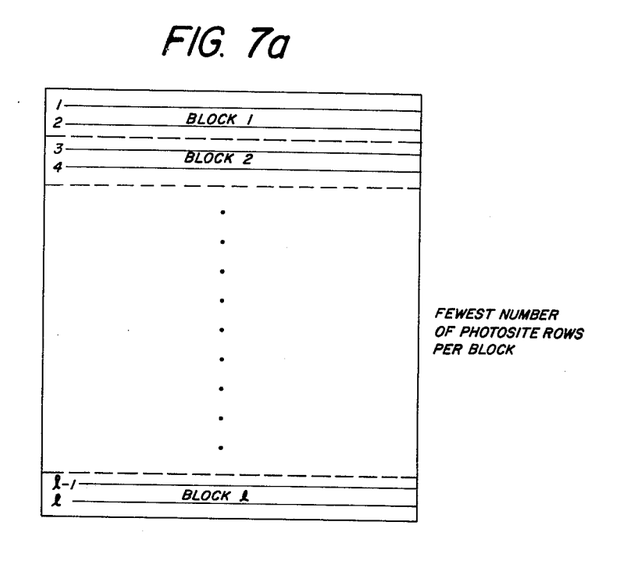
FIGS. 7a and 7b are drawings that illustrate, respectively, block division corresponding to the fewest number and the largest number of photosite rows per block.
Figure 7B:
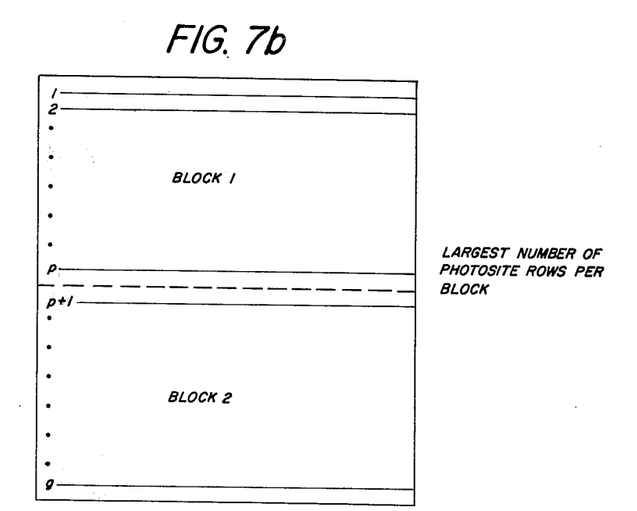

In the general case, an interconnect matrix of output bus lines will connect in common every nth output gate, where n represents the number of photosite rows in a block and is thus an integer between 2 (the fewest possible number of photosite rows in a block, see FIG. 7a) and the total number of photosite rows divided by 2 (the largest number of photosite rows per block when the array is divided into only two blocks, as shown in FIG. 7b). The total number of blocks, therefore, will be equal to the number of photosite rows divided by n, and the number of output bus lines will be reduced to the number of photosite rows divided by the number of blocks.

The invention has been described in detail with reference to certain preferred embodiments thereof, but it will be understood that variations and modifications can be effected within the spirit and scope of the invention. For example, while the disclosed sensor is a p-channel device, it will be apparent that the present invention has applicability to n-channel devices as well.

What is claimed is:

1. Area image sensor apparatus comprising:
   (a) an insulated substrate comprised of semiconductor material of one conductivity type and an overlying layer of electrical insulating material;

(b) a plurality of electrically conductive, spaced enable gate structures extending a given length across said insulated substrate;

(c) a plurality of electrically conductive isolating gate structures extending a given length across said insulated substrate and being so disposed that a respective isolating gate structure lies between adjacent enable gate structures;

(d) a plurality of electrically conductive spaced address gate structures extending across said enable and isolating gate structures to form a plurality of photosites at least one of said pluralities of enable and address gate structures being transmissive to incident radiation;

(e) a plurality of read channels comprising a semiconductor type opposite that of said substrate material, each of said read channels being disposed between alternate pairs of adjacent enable and isolating gate structures;

(f) means for applying a first potential to said enable gate structures to form a plurality of first potential wells in said substrate for the collection of charges integrated in response to incident radiation;

(g) means for applying a second potential to said address gate structures to form a plurality of second potential wells in said substrate;

(h) means for applying a third potential to said isolating gate structures to form a plurality of third potential wells in said substrate;

(i) means for applying an enablement signal to at least one of said enable gate structures to transfer charges collected in corresponding first potential wells to corresponding second potential wells; and (j) means for applying an address signal to at least one of said address gate structures to transfer charges from a corresponding second potential well, through a corresponding one of said third potential wells, and into a corresponding read channel, whereby for each photosite, charge integrated in said substrate material in response to incident radiation passing through said enable gate structure is transferred to said read channel by the application of respective signals to said enable and address gate structures.

2. Apparatus as claimed in claim 1 wherein a plurality of said enable gate structures are electrically connected so that a plurality of photosite rows are enabled simultaneously, thereby enabling said area image sensor to be read out in blocks of photosite rows.

3. Apparatus as claimed in claim 2 wherein each of said address gate structures has a tab portion extending in the space between said enable and isolating gate structures.

4. Apparatus as claimed in claim 3 wherein said address gate structure is comprised of a material that is transmissive to incident radiation.

5. Apparatus as claimed in claim 4 wherein said substrate is suitably doped to form channel stops that prevent charge migration between adjacent photosites.

6. Apparatus as claimed in claim 2 wherein said enable and isolating gate structures are comprised of respective strips of conductive material disposed substantially in parallel.

7. Apparatus as claimed in claim 6 wherein each of said address gate structures has a tab portion extending in the space between said enable and isolating gate structures.

8. Apparatus as claimed in claim 7 wherein: said enable and isolating gate structures are comprised of polysilicon, and said apparatus includes opaque material overlying said isolating gate structure;

said address gate structures are comprised of metallic conductor material; and said substrate semiconductor material is comprised of n-type semiconductor material.

9. Apparatus as claimed in claim 6 wherein said address gate structures are comprised of respective strips of conductive material disposed generally perpendicularly to said enable and isolating gate structures.

10. Apparatus as claimed in claim 9 wherein said address gate structures are comprised of material that is transmissive to incident radiation.

11. Apparatus as claimed in claim 10 wherein said isolating gate structure is comprised of material transmissive to incident radiation, and wherein said apparatus includes opaque material overlying said isolating gate structure.

12. Apparatus as claimed in claim 11 wherein said enable and isolating gate structures are each comprised of polysilicon.

* * * * *

UNITED STATES PATENT AND TRADEMARK OFFICE
CERTIFICATE OF CORRECTION

PATENT NO. : 4,322,638

DATED : March 30, 1982

INVENTOR(S) : Teh-Hsuang Lee and Rajinder P. Khosla

It is certified that error appears in the above-identified patent and that said Letters Patent are hereby corrected as shown below:

Column 2, line 14, delete "rotation," and insert therefor --radiation,--.

Column 3, line 19, delete "the".

Column 4, lines 12-13, delete "$OG_3$-" and "3" bridging lines 12 and 13, and insert therefor --$OG_{33}$--.

Signed and Sealed this

Eighth Day of June 1982

[SEAL]

Attest:

Attesting Officer

GERALD J. MOSSINGHOFF

Commissioner of Patents and Trademarks